(12) United States Patent
Honda

(10) Patent No.: US 6,232,839 B1
(45) Date of Patent: May 15, 2001

(54) VOLTAGE-CONTROLLED AMPLIFIER HAVING COMPENSATION FOR GAIN CONTROL IMBALANCE

(75) Inventor: Hironori Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/311,263

(22) Filed: May 14, 1999

(30) Foreign Application Priority Data

May 15, 1998 (JP) .................................................. 10-133100

(51) Int. Cl.$^7$ ....................................................... H03F 3/45
(52) U.S. Cl. ........................ 330/254; 330/124 R; 330/295
(58) Field of Search ............................... 330/124 R, 254, 330/295, 311, 256

(56) References Cited

U.S. PATENT DOCUMENTS

| | | | |
|---|---|---|---|
| 2,920,281 | * 1/1960 | Appert et al. | 330/124 R |
| 4,888,567 | 12/1989 | Berger et al. | 331/116 |
| 5,057,788 | * 10/1991 | Ushida et al. | 330/310 |
| 5,528,197 | * 6/1996 | Freg | 330/254 |
| 5,682,119 | * 10/1997 | Soda | 330/254 |

FOREIGN PATENT DOCUMENTS

| | | |
|---|---|---|
| 58-202606 | 11/1983 | (JP) . |
| 60-260217 | 12/1985 | (JP) . |
| 63-286015 | 11/1988 | (JP) . |
| 1-144806 | 6/1989 | (JP) . |
| 1-302908 | 12/1989 | (JP) . |
| 4-025209 | 1/1992 | (JP) . |
| 5-81092 | 11/1993 | (JP) . |
| 8-237054 | 9/1996 | (JP) . |
| 10-256852 | 9/1998 | (JP) . |

OTHER PUBLICATIONS

Abstract of European Patent Application No. EP 309769.

* cited by examiner

*Primary Examiner*—Michael B Shingleton
(74) *Attorney, Agent, or Firm*—Sughrue, Mion, Zinn, Macpeak & Seas, PLLC

(57) ABSTRACT

A voltage-controlled amplifier unit 2 amplifies an input signal with a gain variable according to a controlled voltage. A basic amplifier unit 1 amplifies the input signal with at least one fixed gain. An adder 3 adds together the output signals of the voltage-controller amplifier unit 2 and the basic amplifier unit 1.

11 Claims, 6 Drawing Sheets

VOLTAGE-CONTROLLED AMPLIFIER HAVING COMPENSATION FOR GAIN CONTROL IMBALANCE

BACKGROUND OF THE INVENTION

The present invention relates to voltage-controlled amplifiers (hereinafter referred to as VCAs), in which the gain is controlled through voltage control, and more particularly, to VCAs with improved gain control accuracy.

FIG. 5 shows the circuit construction of a prior art VCA. In this VCA, the gain of input signal Vin is controlled by varying control voltage Vc, thus providing output signal Vout. Referring to the Figure, the illustrated VCA comprises pair transistors Q1 and Q2, Q3 and Q5, Q4 and Q6, Q7 and Q8, Q9 and Q10, and Q11 and Q12, having the same characteristics, pair resistors R1 and R2, and R6 and R7, having the same resistance, and pair diodes D1 and D2, having the same characteristics. A difference voltage between the input signal Vin and a reference voltage Vref, is converted by a constant current source 4, the resistors R1 and R2 and the transistors Q1 and Q2 to a difference current, which is reflected by a current mirror which is constituted by the transistors Q3 to Q6. The difference current is divided and re-combined through the transistors Q7 to Q10. The amplitude of the difference current in the resistors R3 and R4 is changed according to the ratio of the division and re-combination. This change is controlled by the difference between base potentials on the transistors Q7 to Q10. This base potential difference is provided by a voltage Vc through a circuit, which is constituted by the transistors Q11 and Q12, the diodes D1 and D2, the resistors R5 to R7 and a constant current source 6. The circuit constituted by the transistors Q11 and Q12, the diodes D1 and D2, the resistors R5 and R7 and the constant current source 6, has the roles of causing circuit gain changes in proportion to the control voltage Vc and also providing a wide range of the voltage Vc. Where these roles are unnecessary, the voltage Vc may be directly applied to the bases of the transistors Q7 to Q10.

FIG. 6 shows the relation between the gain and the control voltage Vc in the above VCA. As shown, the gain is zero when Vc is zero, and increases with increasing Vc. When it is desired to use this VCA with a gain range of 8±2, the maximum gain may be set to 10, and the range of the voltage Vc may be set to be between 6 and 10 as shown as zone b in FIG. 6.

The above VCA, however, is an open-loop amplifier, and is therefore subject to differential current errors due to such adverse effects as those due to VBE characteristics of the differential pair transistors Q1 and Q2, Q7 to Q10, and Q11 and Q12, stemming from the use of these transistors in an unbalanced state, and also those due to early transistor voltages, stemming from the conversion of the input signal to the differential current through the current mirror circuit. The differential current errors deteriorate the linearity characteristics and temperature characteristics. Changes in the linearity and temperature characteristics may lead to a pronounced gain change ΔG2 particularly in the maximum gain side, as shown by the phantom plot in the characteristic in FIG. 6.

FIG. 7 shows a different VCA, which is described in Japanese Patent Disclosure No. 58-202606. Referring to the Figure, the illustrated VCA comprises transistors Q7 to Q10 and Q13 to Q18, resistors R8 to R14, constant current sources 10 to 13 and an operational amplifier 14. Although not described in detail, like the VCA described before, in this circuit the gain of Vout can be controlled through control of Vc. In this VCA, however, Vc is directly applied to the bases of the transistors Q7 to Q10. Thus, although the proportional relation between the gain and Vc as shown in FIG. 6 can not be obtained, the gain can be increased by increasing Vc. In this VCA, an intermediate gain is obtained when Vc is zero. Again in this VCA, the transistors Q7 to Q10 are used in an unbalanced state, and the gain is controlled after conversion of the input signal to the differential current. Therefore, like the VCA shown in FIG. 5, the linearity and temperature characteristics are deteriorated. Particularly, where a VCA is used for the gain correction preceding and succeeding amplifiers, high accurate linearity and temperature characteristics are required for accuracy improvement which is aimed at. With the prior art VCAs, however, it is difficult to meet the above requirements.

An object of the present invention is to improve the linearity and temperature characteristics and provide a VCA which can ensure high gain control accuracy.

According to a first aspect of the present invention, there is provided a voltage-controlled amplifier circuit comprising a voltage-controlled amplifier unit for amplifying an input signal with a gain variable according to a controlled voltage, a basic amplifier unit for amplifying the input signal with at least one fixed gain, and an adder for adding together the output signals of the voltage-controller amplifier unit and the basic amplifier unit.

The gain of the voltage-controlled amplifier unit is variable both positively and negatively from zero at the center of a range, the positive and negative gain ranges being each set to be less than the fixed gain of the basic amplifier unit. The voltage-controlled amplifier unit includes a differential input unit for converting a differential voltage between the input signal and a reference signal to a differential current, a current mirror circuit for transmitting the differential current, a differential amplifier for amplifying the differential current transmitted from the current mirror circuit, and a gain control unit for controlling the gain of the differential amplifier by converting a voltage for controlling the gain to a differential current. The basic amplifier unit includes an operational amplifier for amplifying the differential voltage between the input signal and the reference signal with a fixed gain, the reference signal being commonly used as a reference signal applied to the voltage-controlled amplifier unit. The output of the voltage-controlled amplifier unit is converted to a current output coupled to a resistor connected to the output side of the basic amplifier unit, the resistor serving as the adder.

According to another aspect of the present invention, there is provided a voltage-controlled amplifier circuit comprising: a basic amplifier unit for amplifying an input signal with a predetermined gain to the output signal; a voltage-controlled amplifier unit for amplifying the input signal with a predetermined gain to the output signal and providing a gain variable; and an adder for adding the output signals of the basic amplifier unit and the voltage-controlled amplifier unit and providing the resultant sum signal as a voltage-controlled amplifier output signal, the gain being variable in a range of G1 to G2, the gain of the basic amplifier unit being set to mid point gain G0 between G1 and G2, and the gain of the voltage-controlled amplifier unit being made variable between G1 and G2 with the gain G0 of the basic amplifier unit as the center gain.

The basic amplifier unit amplifies the difference or differential voltage between the input signal Vin and a reference voltage Vref as an input voltage with a predetermined standard gain, and provides the amplified output to the adder, the voltage-controlled amplifier unit includes a differential input unit for converting the differential voltage between the input signal Vin and a reference voltage Vref to a differential current, a current mirror circuit for transmitting the differential current, a differential unit for converting a gain controlled voltage to a differential current, and a gain control unit for controlling the gain according to the output of the differential unit.

Other objects and features will be clarified from the following description with reference to attached drawings.

PREFERRED EMBODIMENTS OF THE INVENTION

Preferred embodiments of the present invention will now be described with reference to the drawings.

Figure 1:
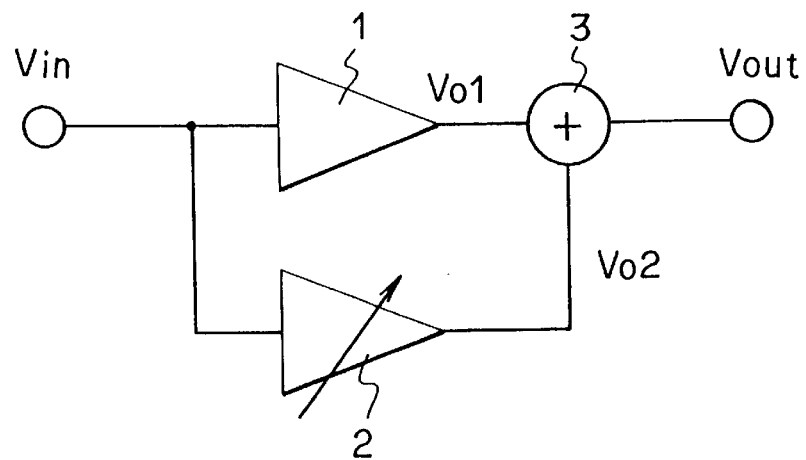
FIG. 1 is a block diagram outlining a voltage-controlled amplifier according to the present invention.

FIG. 1 is a block diagram outlining a VCA according to the present invention. The illustrated VCA comprises a basic amplifier unit 1, a VCA unit 2 providing a gain variable according to the level of Vc, and an adder 3 for adding the output signals Vo1 and Vo2 of the basic amplifier unit 1 and the VCA unit 2, respectively, and providing the resultant sum signal as a VCA output signal. An input signal Vin is amplified with a predetermined gain in the basic amplifier unit 1 to the output signal Vo1, and also it is amplified with a predetermined gain in the VCA 2 to the output signal Vo2. These output signals Vo1 and Vo2 are added together in the adder 3, which thus provides an output signal Vout.

In the VCA according to the present invention, in the case of setting the gain of the output signal Vout with respect to the input signal Vin is variable in a range of G1 to G2, the gain of the basic amplifier unit 1 is set to mid point gain G0 between G1 and G2, and the gain of the VCA unit 2 is made variable between G1 and G2 with the gain G0 of the basic amplifier unit 1 as the center gain. When this is made so, the linearity and temperature characteristics of the VCA unit 2 do not affect the entire output signal, but affect only a change in the gain, i.e., only part of the output signal. This means that the linearity and temperature characteristics of the output signal as a whole are substantially improved.

Figure 2:
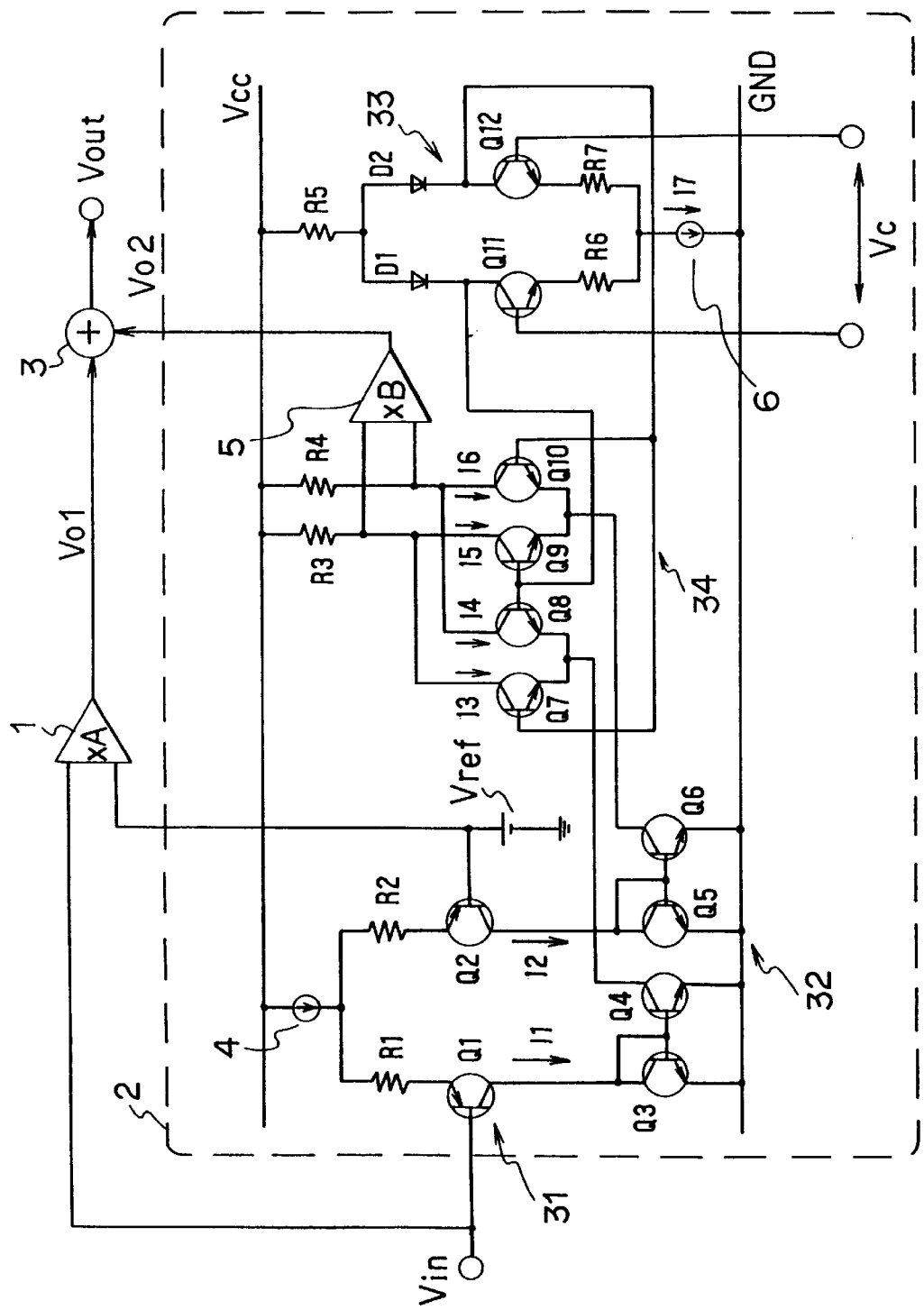
FIG. 2 is a circuit diagram showing an embodiment of the voltage-controlled amplifier according to the present invention.

FIG. 2 is a circuit diagram showing an embodiment of the VCA according to the present invention. As shown, the input signal Vin is coupled to the basic amplifier unit 1 and the VCA unit 2. The basic amplifier unit 1 amplifies the difference or differential voltage between the input signal Vin and a reference voltage Vref as an input voltage with a predetermined standard gain, and provides the amplified output to the adder 3. The VCA unit 2 includes a differential input unit 31 for converting the differential voltage between Vin and Vref to a differential current and constituted by a constant current source 4, resistors R1 and R2 and transistor Q1 and Q2, a current mirror circuit 32 for transmitting the differential current and constituted by transistors Q3 to Q6, a differential unit 33 for converting a gain controlled voltage Vc to a differential current and is constituted by a constant current source 6, resistors R5 to R7, transistors Q11 and Q12 and diodes D1 and D2, a gain control unit 34 for controlling the gain according to the output of the differential unit 33 and constituted by transistors Q7 to Q10 and resistors R3 and R4, and a differential amplifier 5 with the collectors of transistors Q9 and Q10 as two inputs for providing the amplified output to the adder 3. The VCA 2 produces and outputs a signal corresponding to a change in gain from the standard gain. The pair resistors R1 and R2, the pair transistors Q1 and Q2, Q3 and Q5, Q4 and Q6, and Q7 to Q10, the pair resistors R3 and R4, the pair diodes D1 and D2, the pair transistors Q11 and Q12, and the pair resistors R6 and R7, have the same resistance or transistor size. The adder 3 adds together the outputs of the basic amplifier unit 1 and the VCA unit 2 to produce the output signal.

The operation of the embodiment will now be described. The basic amplifier unit 1 amplifies the differential voltage between the input signal Vin and the reference voltage Vref with the standard gain, and provides the amplified signal to the adder 3. Denoting the standard gain of the basic amplifier unit 1 by A, the output signal Vo1 of the basic amplifier unit 1 is $$Vo1 = A \times (Vin - Vref).$$

The VCA unit 2 also amplifies the input signal Vin with a gain corresponding to the level of Vc, and provides the output signal to the adder 3. The gain is zero when Vc is zero, and increases with increasing Vc. The operation when Vc is zero will now be described. The differential voltage between the input signal Vin and the reference voltage Vref is converted by the transistors Q1 and Q2 and the resistors R1 and R2 to a differential current between I1 and I2. Denoting this differential current by dI1, since R1=R2, $$DI1 = (Vin - Vref)/(R1 + R2)$$

$$= (Vin - Vref)/2R1.$$

The currents I1 and I2 are transmitted through the current mirror circuit constituted by the transistors Q3 to Q6 to the transistors Q7 to Q10. When Vc is zero, the base potentials on the transistors Q11 and Q12 are equal, and the currents therein are equal to one half the current in the constant current source 6. Equal currents thus flow in the diodes D1 and D2. Thus, the collector currents I3 and I4 in the transistors Q7 and Q8 are thus $$I3=I4=I1/2,$$

and the collector currents I5 and I6 in the transistors Q9 and Q10 are $$I5=I6=I2/2.$$

Thus, the current caused through the resistor R3 is $$I3+I5=(I1+I2)/2,$$

and the current passed through the resistor R4 is $$I4+I6=(I1+I2)/2.$$

That is, the currents caused through the resistors R3 and R4 are equal.

At this time, the output Vo2 of the VCA unit 2, i.e., of the differential amplifier 5, is zero, and the output Vout of the adder 3 is $$Vout=Vo1+Vo2=Vo1=A\times(Vin-Vref),$$

and is equal to the output of the basic amplifier unit 1.

In operation, when Vc is made sufficiently high, the output Vo1 of the basic amplifier unit 1 is equal to the level as before, and the output Vo2 of the VCA unit 2 is as follows. The operation is the same up to the currents I1 and I2. When Vc is sufficiently high, assuming the base potential on the transistor Q11 to be positive (+), the transistor Q11 is "on" while the transistor Q12 is "off". The current I7 in the constant current source thus mostly flows through the transistor Q11, and does not substantially flow through the transistor Q12. That is, the current I7 flows through the diode D1 to generate a corresponding voltage Vf thereacross, but it does not substantially flow through the diode D2. Thus, the voltage Vf across the diode D2 is far low compared to the voltage across the diode D1. Since the cathode potentials on the diodes D1 and D2 constitute the base potentials on the transistors Q7 to Q10, $$(\text{Base potential on Q7 and Q})>>(\text{Base potential on Q8 and Q9}).$$

Thus, $$I3=I1, I4=0, I5=0, \text{ and } I6=I2,$$

so that the current through the resistor R3 is $$I3+I5=I1,$$

and the current through the resistor R4 is $$I4+I6=I2.$$

Since R3=R4, the input to the differential amplifier 5 is $$R3\times I1-R4\times I2=dI1\times R3.$$

Denoting the gain of the differential amplifier 5 by B, the output Vo2 thereof is $$VO2=B\times dI1\times R3=B\times(Vin-Vref)\times R3/2R1.$$

The maximum gain of the VCA unit 2 is thus determined by determining the values of B, R3 and R1.

The output Vout of the adder 3 is thus $$Vout=Vo1+VO2$$

$$=A\times(Vin-Vref)+B\times(Vin-Vref)\times R3/2R1.$$

Figure 3A:
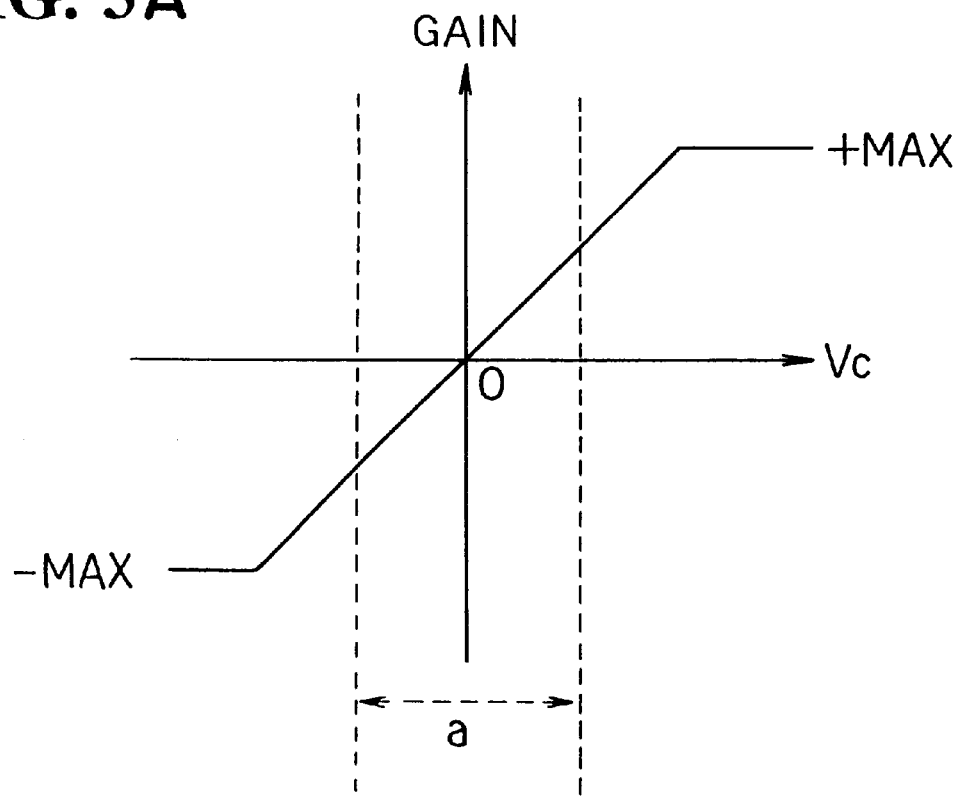
FIGS. 3A and 3B show the relation between the gain of the voltage-controlled amplifier unit 2 and Vc.
Figure 3B:
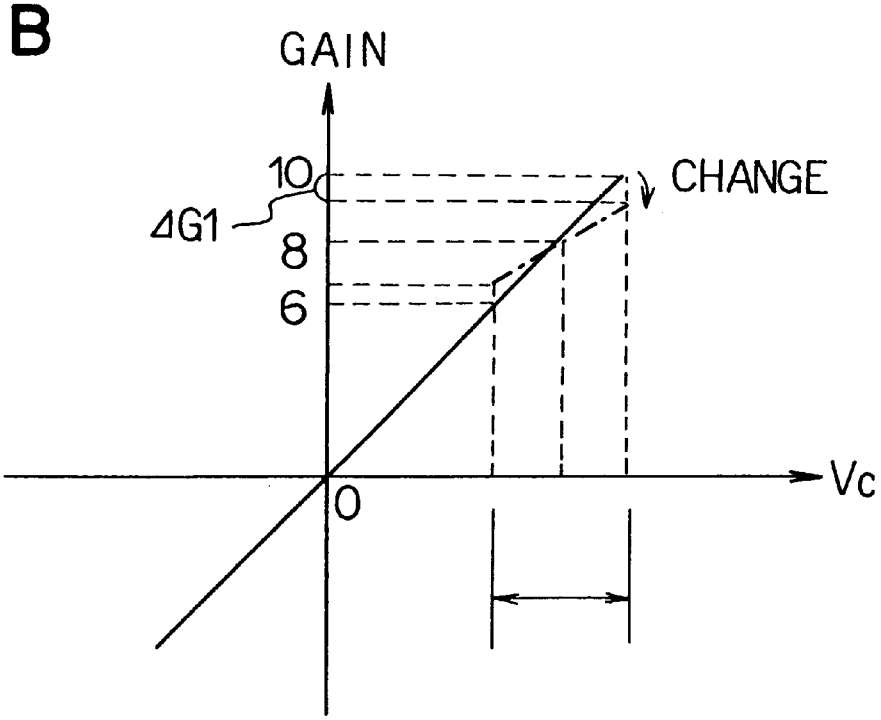

FIG. 3($a$) shows the relation between the gain of the VCA unit 2 and Vc as described above. As shown, the gain is zero when Vc is zero, and at this time Vo2 is also zero. As Vc increases, the gain is increased, and also Vo2 is increased positively. With Vc reduced from zero, the gain is increased in the opposite phase, and Vo2 is increased negatively. From the above, the range of the output Vout that is obtainable by changing Vc is $$Vout=Vo1+Vo2$$

$$=A\times(Vin-Vref)\pm B\times(Vin-Vref) XR3/2R1.$$

When the maximum gain (B×R3/2R1) of the VCA unit 2 is set to C, $$Vout=A\times(Vin-Vref)\pm C\times(Vin-Vref)$$

$$=(A\pm C)\times(Vin-Vref).$$

Since C is changed according to the voltage Vc, the gain of Vout is changed by changing Vc. With this construction of the VCA unit 2 the linearity and temperature characteristics are the better the more the transistors Q11 and Q12 are balanced, that is, the closer Vc is to zero, and are the worse the greater the absolute value of Vc. Thus, in actual operation the working range of Vc is desirably set to be less than one half the maximum available range with the center at zero, such as range as shown in FIG. 3.

Figure 6:
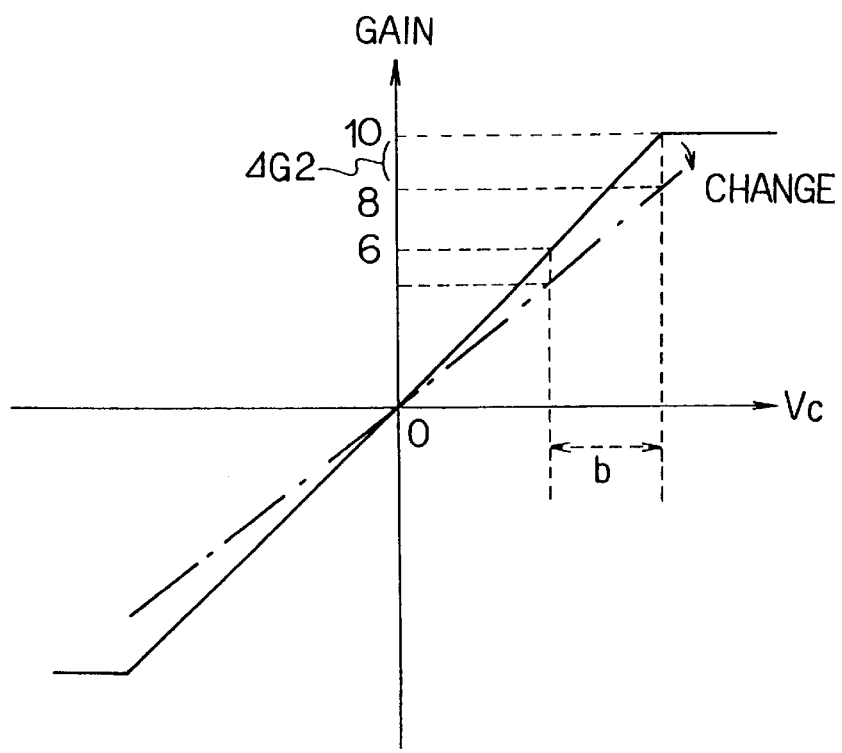
FIG. 6 shows the relation between the gain and the supply voltage Vc in the voltage-controlled amplifier.
Figure 5:
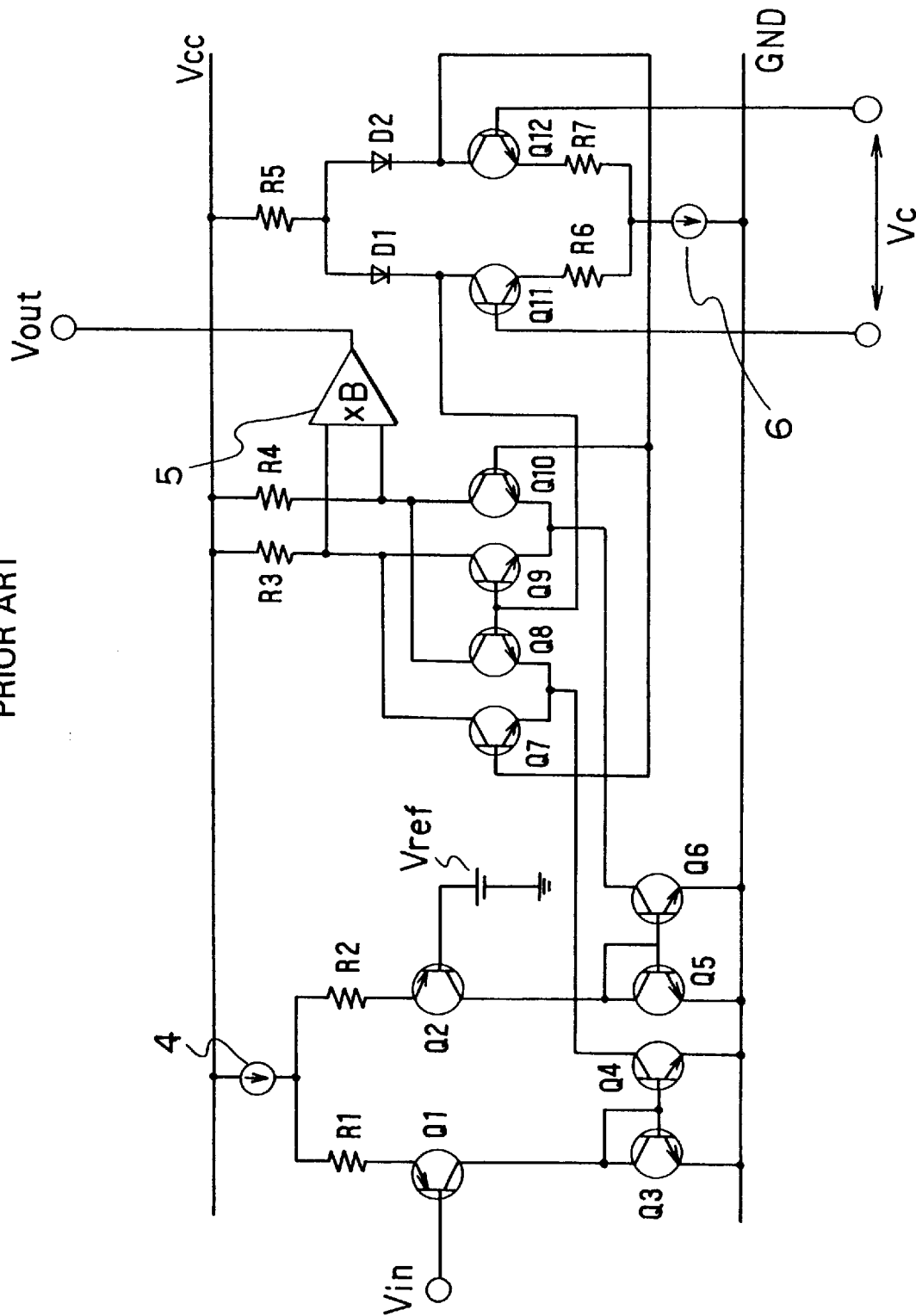
FIG. 5 shows the circuit construction of a prior art voltage-controlled amplifier.
Figure 7:
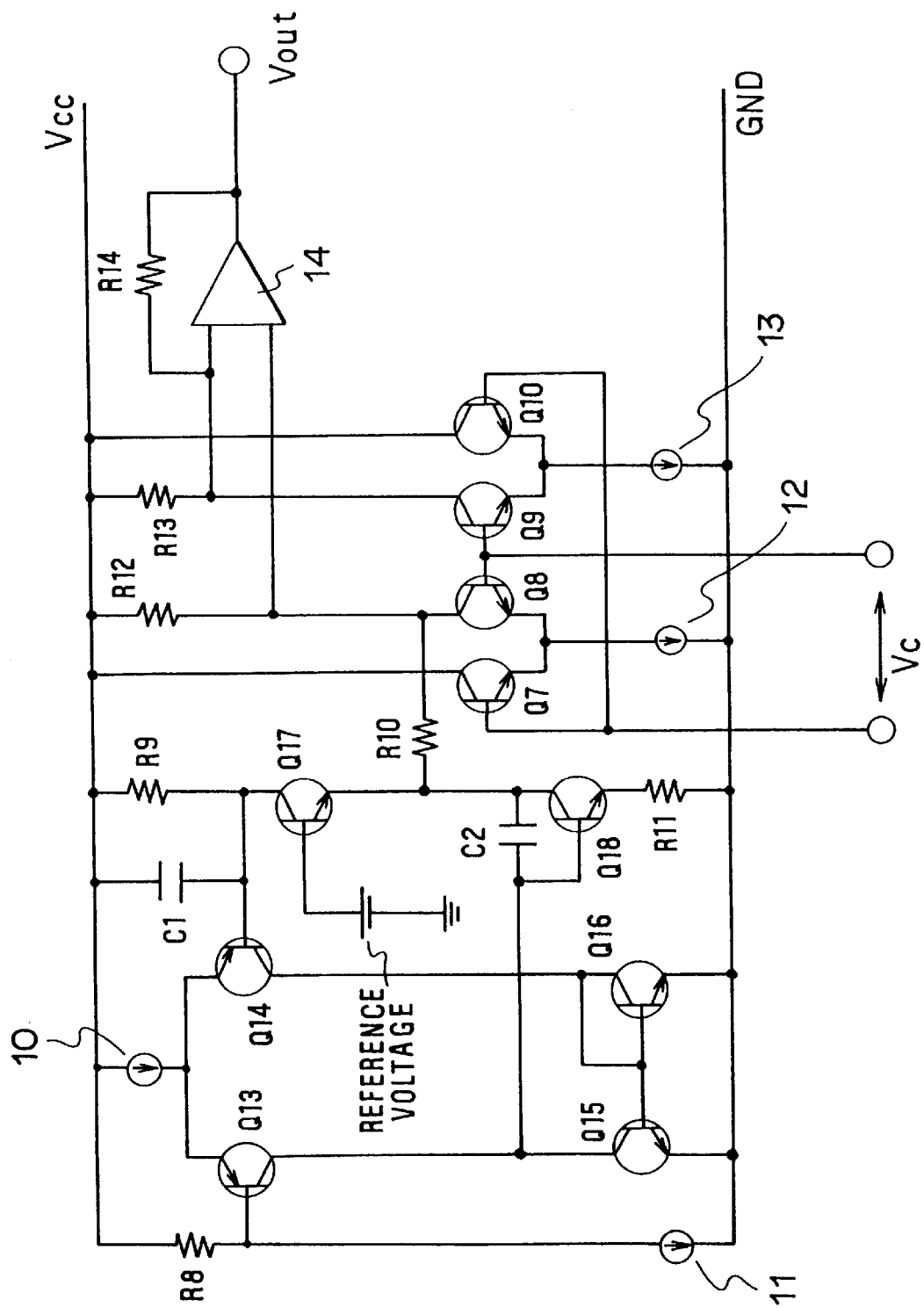
FIG. 7 shows a circuit of a different prior art voltage-controlled amplifier.

As shown above, the final VCA output is obtained by adding the output Vo2 of the VCA unit 2 to the output Vo1 of the basic amplifier unit 1 in the adder 3. For example, a VCA with an overall gain of 8±2 can be obtained by setting the gain of the basic amplifier unit 1 to 8 and setting the gain of the VCA unit 2 to ±2. That is, with an overall VCA gain range of 6 to 10, the gain range of the VCA unit is ±2 as shown in FIG. 3($b$). In this case, when the linearity and temperature characteristics of the VCA unit are varied as shown by the phantom line plot in the Figure, the change ΔG1 in the overall VCA gain with respect to Vc can be suppressed compared to the gain change ΔG2 in the case of the prior art VCA shown in FIGS. 5 and 6. By way of example, with the prior art VCA the adverse effects of deteriorations of the linearity and temperature characteristics is 100% irrespective of the gain, with the VCA according to the present invention the adverse effects is 25% of the overall output signal even when the minimum and maximum gains are set and zero when the standard gain of 8 is set. The VCA according to the present invention is thus more effective when it is desired to make up for standard gain fluctuations due to fluctuations in manufacture or fluctuations of the gain of an overall system including a preceding and succeeding stage circuit.

The reference voltage Vref applied to the basic amplifier unit 1 may not be common to but may be independent of Vref applied to the VCA unit 2. As a further alternative, it is possible to adopt a self-bias structure. The common use of Vref of the basic amplifier unit 1 and the VCA unit 2, however, is advantageous from the standpoint of simplifying the circuit construction.

Figure 4:
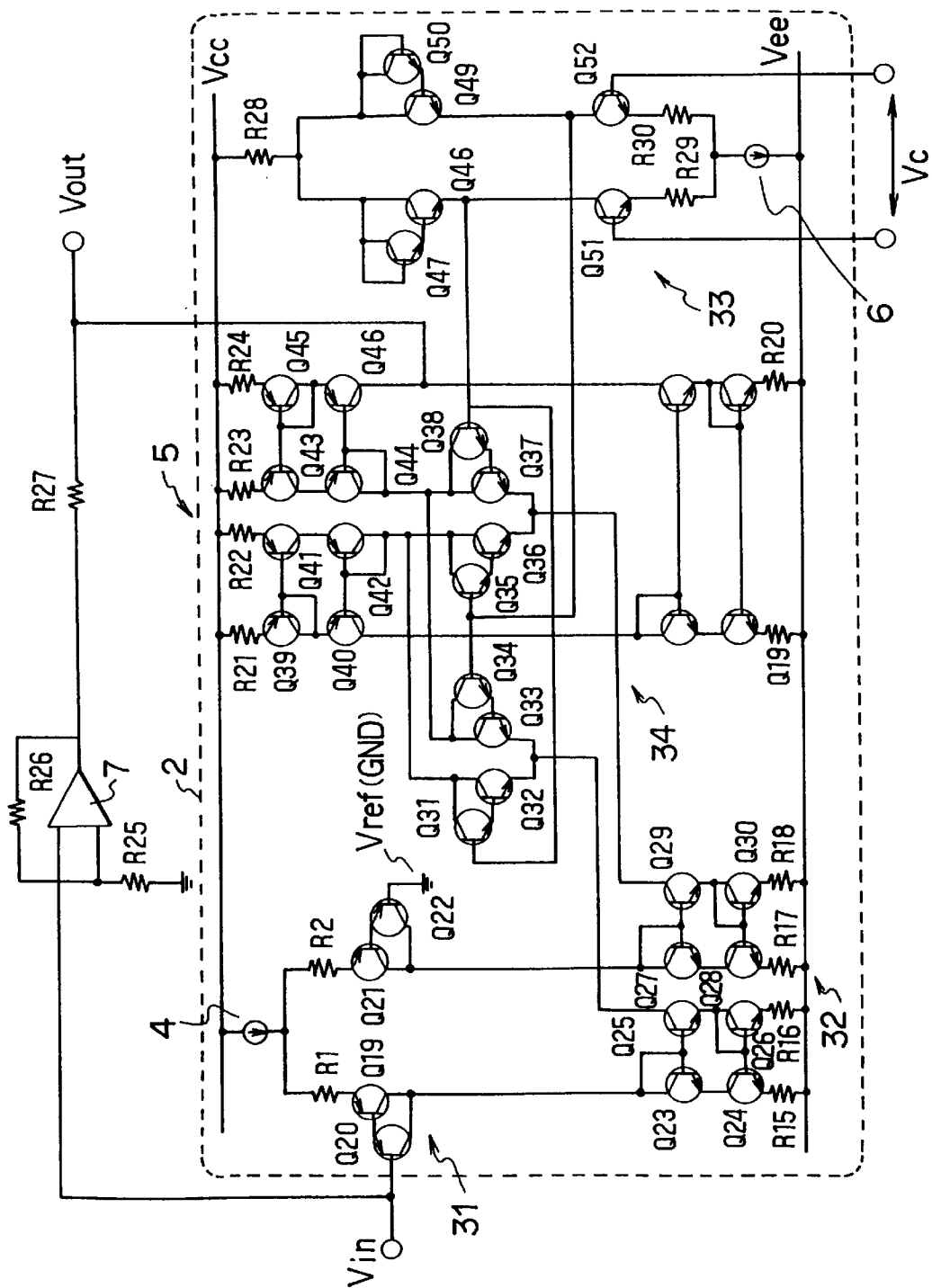
FIG. 4 shows a different embodiment of the present invention.

FIG. 4 shows a different embodiment of the present invention. This embodiment is basically the same as the preceding embodiment, and like parts are designated by like reference numerals. In this embodiment, for providing a more accurate circuit, differential pair transistors in various parts are Darlington connected, and the current mirror circuit has a structure such as to cancel errors due to adverse effects of base currents and early transistor voltages. Furthermore, the output signal of the VCA unit 2 is not a voltage output but a current output. Moreover, a resistor R27 is used to add together the output signals of the basic amplifier unit 1 and the VCA unit 2. This can simplify the circuit of the adder. It is of course possible to use a subtracter in lieu of the adder. Where the output impedance of the preceding stage circuit with Vin coupled thereto is sufficiently low and the standard gain is unity, the basic amplifier unit constituted by resistors R25 and R26 and an operational amplifier 7 may be omitted, and Vin may be directly coupled to one terminal of the resistor R27.

As has been described in the foregoing, the VCA according to the present invention comprises a VCA unit with an input signal gain variable according to a controlled voltage, a basic amplifier unit for amplifying the input signal with at least one fixed gain, and an adder for adding together the output signals of the VCA unit and the basic amplifier unit. Thus, when obtaining a desired gain range, it is possible to reduce the gain range of the VCA unit, thus improving the linearity and temperature characteristics of the VCA and permitting highly accurate gain control. Particularly, in the VCA unit the gain is variable both positively and negatively from zero at the center of the range. This means that it is possible to vary the gain both positively and negatively in a range with the gain of the basic amplifier unit at the center and narrower than the gain of the basic amplifier unit. Thus, it is possible to further improve the linearity and temperature characteristics of the VCA.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A voltage-controlled amplifier circuit comprising:
   a voltage-controlled amplifier unit for amplifying an input signal with a gain variable according to a controlled voltage, the voltage-controlled amplifier unit having a first output signal;
   a basic amplifier unit for amplifying the input signal with a fixed gain, the basic amplifier unit having a second output signal: and,
   an adder for adding together the output signals of the voltage-controller amplifier unit and the basic amplifier unit in order to continuously compensate an event of imbalance in the gain variation of the voltage-controlled amplifier unit.

2. The voltage-controlled amplifier circuit according to claim 1, wherein the gain of the voltage-controlled amplifier unit is variable both positively and negatively from zero at a center of a range, the positive and negative gain ranges each being set to be less than the fixed gain of the basic amplifier unit.

3. The voltage-controlled amplifier circuit according to claim 1, wherein the voltage-controlled amplifier unit includes a differential input unit for converting a differential voltage between the input signal and a reference signal to a differential current, a current mirror circuit for transmitting the differential current, a differential amplifier for amplifying the differential current transmitted from the current mirror circuit, and wherein the gain control unit controls a gain of the differential amplifier by converting a voltage for controlling the gain to a differential current.

4. The voltage-controlled amplifier circuit according to claim 3, wherein the basic amplifier unit includes an operational amplifier for amplifying the differential voltage between the input signal and the reference signal with the fixed gain, the reference signal being commonly used as a reference signal applied to the voltage-controlled amplifier unit.

5. The voltage-controlled amplifier circuit according to claim 1, further
   including a resistor connected to the output of the basic amplifier unit, the output of the voltage-controlled amplifier being coupled to said resistor, whereby the coupling of the voltage-controlled amplifier output to the resistor effects the adding of the voltage-controlled amplifier output with the basic amplifier unit output.

6. A voltage-controlled amplifier circuit comprising:
   a basic amplifier unit for amplifying an input signal with a first predetermined gain the basic amplifier having a first output signal;
   a voltage-controlled amplifier unit for amplifying the input signal with a variable gain and for amplifying with a second predetermined gain and then outputting a second output signal; and
   an adder for adding the output signals of the basic amplifier unit and the voltage-controlled amplifier unit and providing the resultant sum signal as a voltage-controlled amplifier output signal, a corresponding overall circuit gain being variable in a range of G1 to G2, the gain of the basic amplifier unit being set to a mid point gain G0 between G1 and G2, and the gain of the voltage-controlled amplifier unit being variable between G1 and G2 with the gain G0 as the center gain of the voltage-controlled amplifier unit.

7. A voltage-controlled amplifier circuit comprising:
   a basic amplifier unit that amplifies a difference or differential voltage, between the input signal Vin and a reference voltage Vref, with a predetermined standard gain, and provides an amplified output;
   a voltage-controlled amplifier unit that includes a differential input unit for converting the differential voltage between the input signal Vin and the reference voltage Vref to a first differential current, a current mirror circuit for transmitting the differential current, a differential unit for converting a gain controlled by a controlled voltage to a second differential current, and a gain control unit for controlling the gain according to the second differential current, the voltage-controlled amplifier unit thereby amplifying the input signal with a variable gain, the voltage-controlled amplifier unit also amplifying with a second predetermined gain to thereby output a second output signal; and an adder for adding the output signals of the basic amplifier unit and the voltage-controlled amplifier unit and providing the resultant sum signal as a voltage-controlled amplifier output signal, a corresponding overall circuit gain being variable in a range of G1 to G2, the gain of the basic amplifier unit being set to a mid point gain G0 between G1 and G2, and the gain of the voltage-controlled amplifier unit being variable between G1 and G2 with the gain G0 as the center gain of the voltage-controlled amplifier unit.

8. The voltage-controlled amplifier circuit according to claim 2, wherein the voltage-controlled amplifier unit includes a differential input unit for converting a differential voltage between the input signal and a reference signal to a differential current, a current mirror circuit for transmitting the differential current, a differential amplifier for amplifying the differential current transmitted from the current mirror circuit, and a gain control unit for controlling the gain of the differential amplifier by converting a voltage for controlling the gain to a differential current.

9. The voltage-controlled amplifier circuit according to claim 8, wherein the basic amplifier unit includes an operational amplifier for amplifying the differential voltage between the input signal and the reference signal with a fixed gain, the reference signal being commonly used as a reference signal applied to the voltage-controlled amplifier unit.

10. The voltage-controlled amplifier circuit according to claim 2, wherein the output of the voltage-controlled amplifier unit is converted to a current output coupled to a resistor connected to the output side of the basic amplifier unit, the resistor serving as the adder.

11. The voltage-controlled amplifier circuit according to claim 3, wherein the output of the voltage-controlled amplifier unit is converted to a current output coupled to a resistor connected to the output side of th e basic amplifier unit, the resistor serving as the adder.

* * * * *